(12) United States Patent  
Chen et al.

(10) Patent No.: US 8,698,110 B2
(45) Date of Patent: Apr. 15, 2014

(54) ION IMPLANTING SYSTEM

(75) Inventors: Heng-Gung Chen, Hsinchu (TW); Shih-Chieh Jang, Longtan Township, Taoyuan County (TW)

(73) Assignee: Advanced Ion Beam Technology, Inc., Hsinchu (TW)

( * ) Notice: Subject to any disclaimer, the term of this patent is extended or adjusted under 35 U.S.C. 154(b) by 0 days.

(21) Appl. No.: 13/101,892

(22) Filed: May 5, 2011

(65) Prior Publication Data

US 2012/0280137 A1   Nov. 8, 2012

(51) Int. Cl.
  *G21K 5/00*   (2006.01)
(52) U.S. Cl.
  USPC ............... 250/492.3; 250/492.1; 250/397
(58) Field of Classification Search
  USPC ............... 250/492.1, 492.2, 492.21, 492.22, 250/492.3, 396 R, 397
  See application file for complete search history.

(56) References Cited

U.S. PATENT DOCUMENTS

| | | | |
|---|---|---|---|
| 6,297,510 B1 * | 10/2001 | Farley | 250/492.21 |
| 2005/0191409 A1 * | 9/2005 | Murrell et al. | 427/8 |
| 2006/0022147 A1 * | 2/2006 | Lin et al. | 250/492.21 |
| 2012/0061560 A1 * | 3/2012 | Chen | 250/281 |

FOREIGN PATENT DOCUMENTS

| | | |
|---|---|---|
| JP | 55-160427 | 12/1980 |
| JP | 02-037657 | 2/1990 |
| JP | 05-047341 | 2/1993 |
| JP | 09-045274 | 2/1997 |
| JP | 11-086775 | 3/1999 |
| JP | 2005-203771 | 7/2005 |
| JP | 2005-522844 | 7/2005 |

* cited by examiner

*Primary Examiner* — Nicole Ippolito
(74) *Attorney, Agent, or Firm* — Muncy, Geissler, Olds & Lowe, P.C.

(57) ABSTRACT

An ion implanting system includes an ion beam generator, a mass separation device, a holder device and a first detector. The ion beam generator is configured for generating a first ion beam. The mass separation device is configured for isolating a second ion beam comprising required ions from the first ion beam. The holder device is configured for holding a least one substrate. The holder device and the first detector reciprocate relative to the second ion beam along a first direction to make the substrate and the first detector pass across a projection region of the second ion beam, wherein the first detector is configured for obtaining relevant parameters of the second ion beam. The above-mentioned system is able to obtain the relevant parameters of the ion beam during ion implantation so that the system may immediately adjust the fabrication parameters to obtain better effect of ion implantation.

11 Claims, 6 Drawing Sheets

ION IMPLANTING SYSTEM

BACKGROUND OF THE INVENTION

1. Field of the Invention

The present invention relates to an ion implanting system, and more particularly to an ion implanting system which is able to obtain relevant parameters of an ion beam during ion implantation.

2. Description of the Prior Art

In a fabrication process for integrated circuits, an ion implanting system is configured for implanting an impurity into a semiconductor material. An ion implanting process includes ionizing required impurity elements, selecting the ions with a desired mass/charge ratio, targeting the selected ions toward a substrate, such as a semiconductor wafer, and implanting the impurity elements into the substrate.

In the ion implanting process, the implanted amount of impurity elements must be precisely controlled. The ion implanting process involves first detecting relevant parameters of an ion beam (such as ion beam density) by a detector, and then based on the parameters measured by the detector adjusting fabrication parameters of the system to make the relevant parameters of ion beam meet a desired setting value, and then after substrates are placed on the projection region of ion beam, implanting ions. Relevant parameters of ion beam can not be obtained during ion implantation; consequently, the ion implanting system of the prior art can not justify the fabrication parameters of the system to control implant process without holding the implant first.

According to the foregoing descriptions, it is highly desirable to obtain relevant parameters of the ion beam as a basis for adjusting the fabrication parameters during ion implantation.

SUMMARY OF THE INVENTION

The present invention is directed to an ion implanting system including a detector which can pass across a projection region of an ion beam to obtain relevant parameters of the ion beam during ion implantation.

Therefore, according to the relevant parameters of the ion beam obtained by the detector, the system of the present invention may immediately adjust fabrication parameters to obtain a better effect of ion implantation.

In one embodiment, the proposed ion implanting system includes an ion beam generator, a mass separation device, a holder device and a first detector. The ion beam generator is configured for generating a first ion beam. The mass separation device is arranged at the downstream side of the first ion beam and configured for isolating a second ion beam comprising required ions from the first ion beam. The holder device is arranged at the downstream side of the second ion beam and configured for holding a least one substrate, wherein the holder device and the second ion beam reciprocate relative to each other along a first direction to make the substrate pass across a projection region of the second ion beam. The first detector reciprocates relative to the second ion beam and passes across the projection region of the second ion beam to obtain relevant parameters of the second ion beam while ion implanting, wherein the first detector is arranged between the substrates, and the first detector is connected with the holder device or arranged at the upstream side of the holder device relative to the second ion beam.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

The detailed explanation of the present invention is described as follows. The described preferred embodiments are presented for purposes of illustrations and description, and they are not intended to limit the scope of the present invention.

Figure 1:
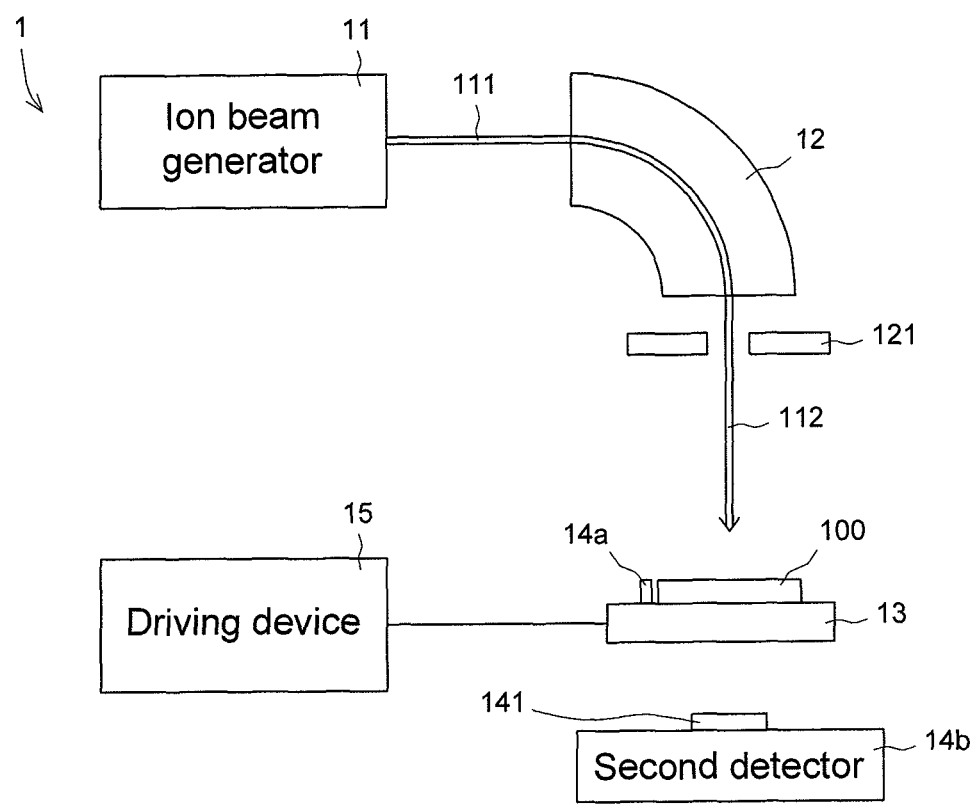
FIG. 1 is a diagram schematically illustrating an ion implanting system according to an embodiment of the present invention.

Referring to FIG. 1, the ion implanting system 1 according to an embodiment of the present invention includes an ion beam generator 11, a mass separation device 12, a holder device 13, and a first detector 14a. The ion beam generator 11 is configured for generating a first ion beam 111. For example, the ion beam generator 11 ionizes the source ion gas in the plasma chamber by arc discharge induced electron bombardment or the like to produce plasma. Next, it extracts the ions from the plasma chamber to form a first ion beam 111. The mass separation device 12 is arranged on the downstream side of the first ion beam 111 for isolating a second ion beam 112 containing the required ions from the first ion beam 111. For example, the mass separation device 12 can separate the ions with the desirable mass/charge ratio from the path of the first ion beam 111 by using a magnetic field. The mass separation device 12 then applies a shield 121 to block the unwanted ions and allows only the desired ions to pass through to form the second ion beam 112. According to an embodiment, the second ion beam 112 may be ribbon-shaped or gaussian-shaped.

The holder device 13 is arranged on the downstream side of the second ion beam 112, and configured for holding a least one substrate 100. According to an embodiment, the substrate 100 may be a semiconductor wafer. The holder device 13 and the second ion beam 112 reciprocate relative to each other along a first direction, making the substrate 100 pass across the projection region of the second ion beam 112 in a reciprocating manner. In other words, the second ion bean 112 can scan across the entire substrate 100. According to an embodiment, the holder device 13 is connected with a driving device 15. The driving device 15 drives the holder device 13 to reciprocate relative to the second ion beam 112 along the first direction, making the substrate 100 pass across the projection region of the second ion beam 112 in a reciprocating manner. Preferably, the driving device 15 also drives the holder device 13 to move along a second direction, making the second ion beam 112 scan across the entire substrate 100. According to an embodiment, the first direction and the second direction are substantially perpendicular to each other, making the second ion beam 112 to comprehensively scan the substrate 100 along the left-right direction and the up-down direction. It should be noted that the moving path of the substrate 100 along the first direction may be in straight line or arc. In addition, the second direction may be parallel, for the isocentric scan case, to the plane where the substrate lies, or at an angle to the plane for the non-isocentric scan case.

The first detector 14a reciprocates relative to the second ion beam 112 and passes across the projection region of the second ion beam 112. According to an embodiment, the first detector 14a and the substrate 100 move together, and therefore, the first detector 14a can obtain relevant parameters of the second ion beam 112. For example, the relevant parameter of the second ion beam 112 may be the beam current, parallelism, incident angle, ion beam density, charging sensor response, ion beam profile shape of the second ion beam, or the combination thereof. Since the first detector 14a passes across the projection region of the second ion beam 112, the complete relevant parameters of the second ion beam 112 can be obtained even though the shorter axis of the detection zone of the first detector 14a is smaller than the projection region of the second ion beam 112. In other words, the dimension of the first detector 14a in the first direction can be significantly reduced while not affecting the ability of acquiring the relevant parameter of the second ion beam 112. According to an embodiment, the first detector 14a may be a Faraday cup.

Figure 2:
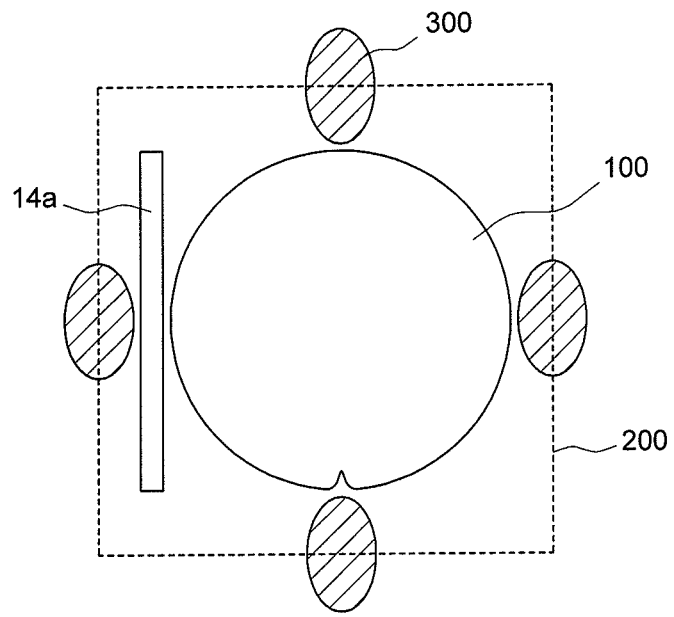
FIG. 2 is a diagram schematically illustrating relative positions among scanning zone of an ion beam, a substrate and a first detector according to an embodiment of the present invention.

Referring to FIG. 2, in one embodiment, the second ion beam 112 may be a gaussian-shaped. It means that the ion beam density of the central area within the projection region 300 of the second ion beam 112 is larger than that of peripheral area. In order to obtain uniform concentration of implanted ion, the substrate 100 and the first detector 14a must pass across the projection region 300 of the second ion beam 112. Consequently, the scanning zone 200 of the second ion beam 112 is larger than the area of the substrate 100, and the first detector 14a, arranged next to the substrate 100 and within the scanning zone 200 of the second ion beam 112, can obtain the relevant parameters of the second ion beam 112 during ions are implanted. When the second ion beam 112 scans to the same area of the substrate 100, the ion implanting system 1 may immediately adjust the fabrication parameters to compensate the previous scanned result to obtain a better effect of ion implantation. It should be noted that a plurality of the first detectors 14a can be arranged at the opposite sides of the substrate 100 respectively to obtain the relevant parameters of the second ion beam 112 at the beginning and end of a single scanning path.

Figure 3:
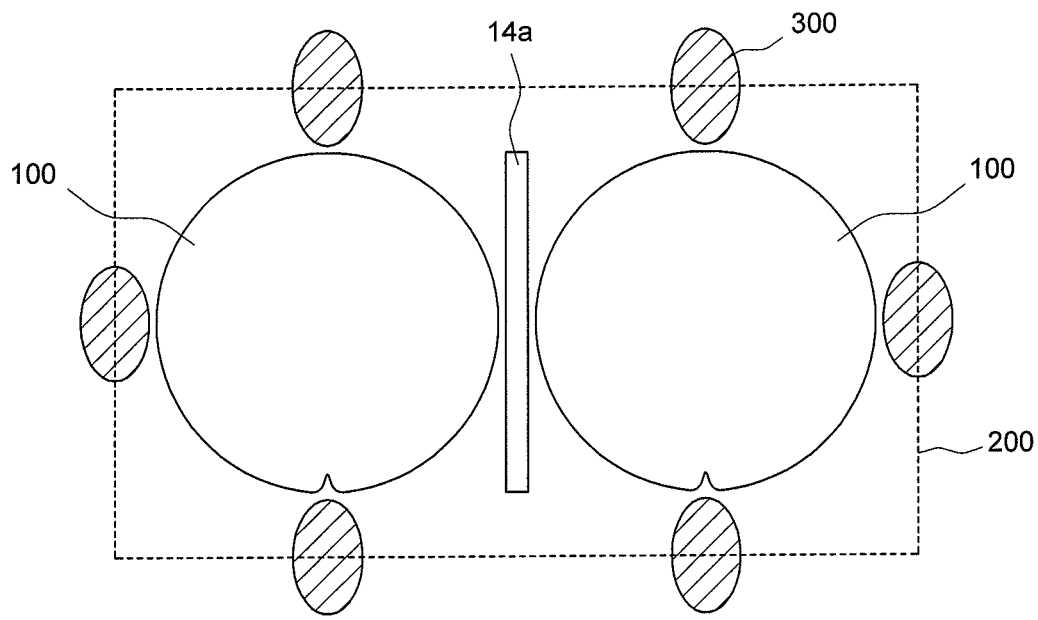
FIG. 3 is a diagram schematically illustrating relative positions among scanning zone of an ion beam, a substrate and a first detector according to another embodiment of the present invention.

Referring to FIG. 3, according to an embodiment, the holder device 13 holds a plurality of substrates 100 and the first detector 14a may be arranged between the plurality of substrates 100. It may improve the utilization rate of the ion beam that processes the substrates 100 simultaneously in the ion implanting process. And during the ion implanting process, the first detector 14a arranged between the substrates 100 can provide relevant parameters of the ion beam to facilitate the following compensation.

Figure 4:
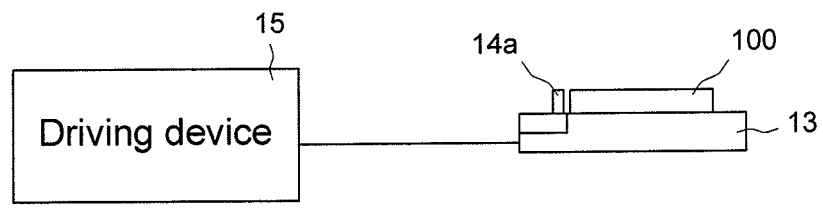
FIG. 4 is a diagram schematically illustrating arrangement of a first detector and a holder device of an ion implanting system according to an embodiment of the present invention.
Figure 5:
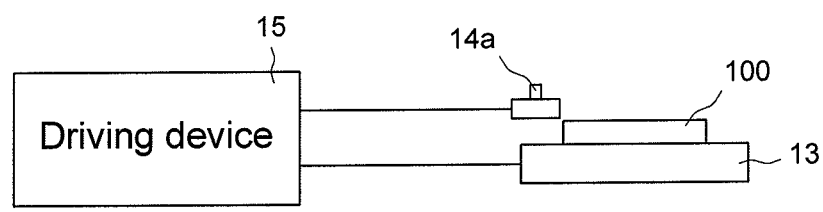
FIG. 5 is a diagram schematically illustrating arrangement of a first detector and a holder device of an ion implanting system according to another embodiment of the present invention.

According to an embodiment, the first detector 14a is connected with the holder device 13 in a fixed manner, as illustrated in FIG. 1, but the present invention is not limited to be implemented as such. The first detector 14a can be operated jointly with the holder device 13, as illustrated in FIG. 4, or independently with the holder device 13, as illustrated in FIG. 5. For example, the first detector 14a can move along the first direction to obtain relevant parameters of the second ion beam 112 while the holder device 13 is stationed at home or loading position.

Referring to FIG. 1 again, according to an embodiment, the ion implanting system 1 according to an embodiment of the present invention includes a second detector 14b which is arranged on the downstream side of the second ion beam 112. For example, the second detector 14b can be arranged on the end behind the holder device 13. When the holder device 13 is not on the path of the second ion beam 112, the second detector 14b can obtain the relevant parameters of the second ion beam 112 to be the base for tuning the second ion beam 112. Another example of the embodiment, it is also desirable to have the second detector 14b obtaining the relevant parameters on the portion of second ion beam 112 which is not blocked by the first detector 14a during scan and used in combine. According to an embodiment, the detection zone 141 of the second detector 14b is larger than the projection region of the second ion beam 112. It should be noted that the ion moving path from the ion beam generator 11 to the second detector 14b is enclosed by a vacuum container (not shown), and ion implantation is maintained in a vacuum environment to a certain extent.

Figure 6:
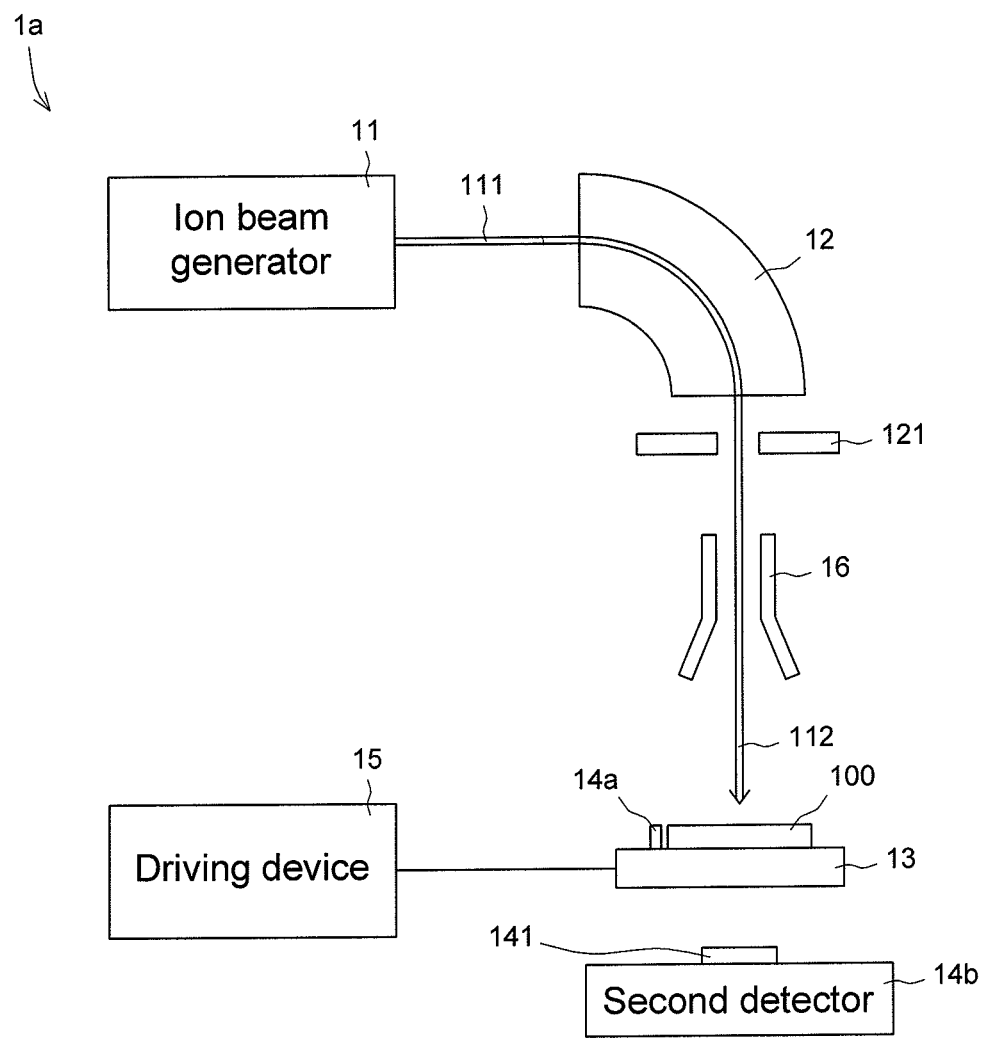
FIG. 6 is a diagram schematically illustrating an ion implanting system according to another embodiment of the present invention.
Figure 7A:
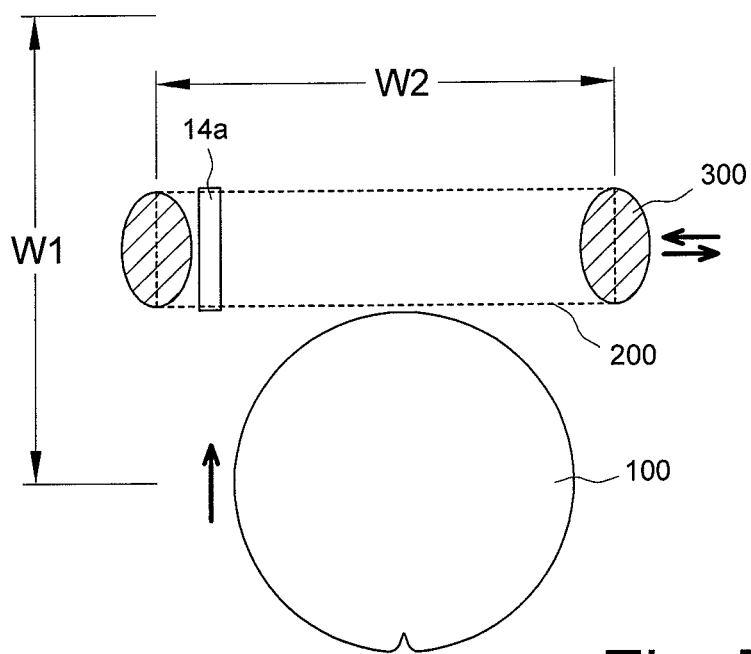
FIG. 7a, FIG. 7b and FIG. 7c are diagrams schematically illustrating relative positions among scanning zone of an ion beam, a substrate and a first detector according to another embodiment of the present invention.
Figure 7B:
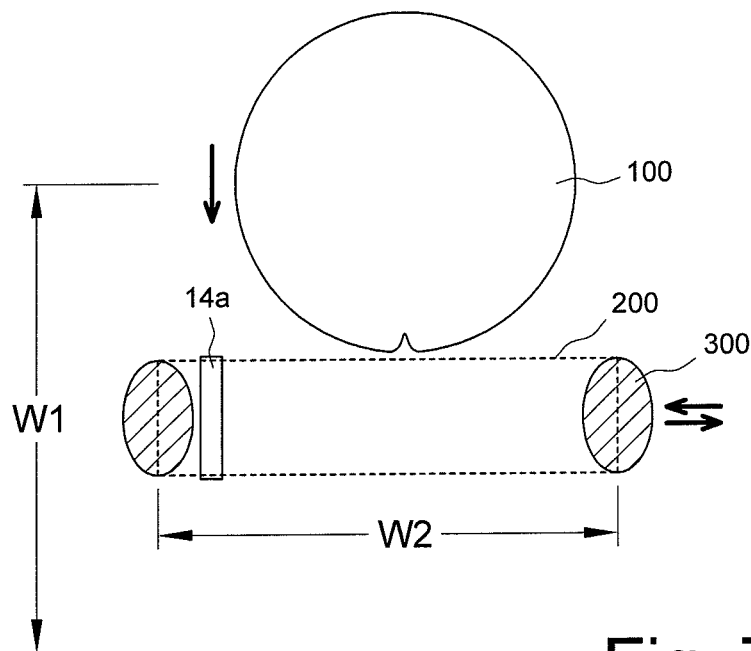
Figure 7C:
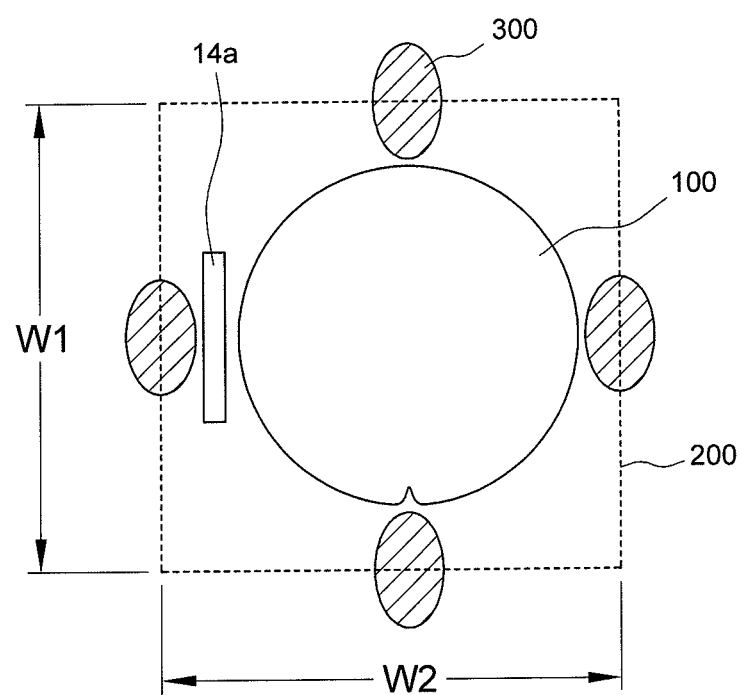

Referring to FIG. 6, the ion implanting system 1a according to another embodiment of the present invention includes a scanning device 16 arranged between the mass separation device 12 and the holder device 13. The scanning device 16 can deflect the second ion beam 112, making the second ion beam 112 scan the substrate 100 along a left-right direction and up-down direction. Alternatively, the scanning device 16 deflects the second ion beam 112 toward the left-right direction and a driving device 15, further included in the ion implanting system 1a, drives the holder device 13 to move along the up-down direction. With the relative motion between the second ion beam 112 and the holder device 13, the second ion beam 112 may comprehensively scan the substrate 100 along the left-right direction and the up-down direction. For example, referring to FIG. 7a, FIG. 7b and FIG. 7c, the second ion beam 112 scans the substrate 100 along left-right direction within the range W2, while the substrate 100 moves along the up-down direction within the range W1. In this way, the scanning zone of the second ion beam 112 is equivalent to the scanning zone 200 as illustrated in FIG. 7c. From the scanning zone 200 as illustrated in FIG. 7c we can see that the relevant parameters of the second ion beam 112 may be completely obtained during ion implantation as long as the length of the first detector 14a is large enough to cover the height of the beam for the case of Gaussian-shaped beam during two dimensional scan or the height that covers the second ion beam of interest, the region that covers the dimension of the substrate 100 for the case of one dimensional scan.

To summarize the foregoing descriptions, ion implanting system of the prevent invention includes a first detector which can pass across a projection region of an ion beam to obtain relevant parameters of the ion beam during ion implantation.

Therefore, the system of the present invention may immediately adjust fabrication parameters or holding the implant process upon detecting out-of control cases based on the relevant parameters of the ion beam obtained by the detector to obtain a better effect of ion implantation.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. An ion implanting system comprising:
    an ion beam generator configured for generating a first ion beam;
    a mass separation device arranged at the downstream side of the first ion beam and configured for isolating a second ion beam comprising required ions from the first ion beam;
    a holder device arranged at the downstream side of the second ion beam and configured for holding a plurality of substrates, wherein the holder device and the second ion beam reciprocate relative to each other along a first direction to make the substrates pass across a projection region of the second ion beam and the plurality of substrates are arranged adjacently along the first direction;
    a first detector reciprocating relative to the second ion beam and passing across the projection region of the second ion beam to obtain parameters of the second ion beam while ion implanting, wherein the first detector is arranged adjacent the substrates, and capable of operating independently to the holder device;
    a second detector arranged at the downstream side of the second ion beam and behind the holder device and configured for obtaining the parameters of the second ion beam; and
    a driving device connected and driving the first detector and the holder device in a manner that the first detector and the holder device operate independently while ion implanting.

2. The ion implanting system according to claim 1, wherein the shorter axis of the detection zone of the first detector is smaller than the projection region of the second ion beam.

3. The ion implanting system according to claim 1, wherein the longer axis of the detection zone of the first detector have same or longer length than the dimension of the substrate.

4. The ion implanting system according to claim 1, wherein the driving device is further configured for driving the holder device moving along a second direction, wherein the second direction is parallel to the plane Where the substrate lies, or at an angle to the plane.

5. The ion implanting system according to claim 1, further comprising
    a scanning device arranged between the mass separation device and the holder device, and configured for deflecting the second ion beam along the first direction to pass across the substrate in a reciprocating manner.

6. The ion implanting system according to claim 5, wherein the driving device is further configured for moving the holder device along a second direction, wherein the second direction is parallel to the plane where the substrate lies, or at an angle to the plane.

7. The ion implanting system according to claim 1, wherein the second detector is used to obtain the parameters from a portion of the second ion beam which is not intercepted by the first detector during scan in a substantially synchronized manner and complementary to that from the first detector.

8. The ion implanting system according to claim 1, wherein the detection zone of the second detector is larger than the projection region of the second ion beam.

9. The ion implanting system according to claim 1, wherein the second ion beam is ribbon-shaped or gaussian-shaped.

10. The ion implanting system according to claim 1, wherein the parameter of the second ion beam comprises the beam current, parallelism, incident angle, ion beam density, charging sensor response, ion beam profile shape of the second ion beam, or the combination thereof.

11. The ion implanting system according to claim 1, wherein the substrate comprises a semiconductor wafer.

\* \* \* \* \*